United States Patent
Yamamoto

(10) Patent No.: US 6,859,067 B2
(45) Date of Patent: Feb. 22, 2005

(54) SEMICONDUCTOR APPARATUS

(75) Inventor: Akiyoshi Yamamoto, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 663 days.

(21) Appl. No.: 09/873,470

(22) Filed: Jun. 4, 2001

(65) Prior Publication Data
US 2001/0050578 A1 Dec. 13, 2001

(30) Foreign Application Priority Data
Jun. 5, 2000 (JP) .......................... 2000-167195

(51) Int. Cl.⁷ .......................................... H03K 19/0175
(52) U.S. Cl. ........................ 326/80; 324/765; 326/16; 326/33; 327/538
(58) Field of Search .............................. 326/16, 33, 80; 324/765, 763; 327/538

(56) References Cited

U.S. PATENT DOCUMENTS 6,339,357 B1 * 1/2002 Yamasaki et al. ............ 327/538
6,469,573 B2 * 10/2002 Kanda et al. ................. 327/541

FOREIGN PATENT DOCUMENTS

| JP | 05-52900 | 3/1993 |
| JP | 09-63277 | 3/1997 |
| JP | 11-16342 | 1/1999 |
| JP | 11-66890 | 3/1999 |
| JP | 11-88146 | 3/1999 |
| JP | 11-134864 | 5/1999 |

OTHER PUBLICATIONS

Japanese Office Action of Aug. 17, 2004.

English Translations of the indicated portions of the above-referenced Japanese Office Action.

* cited by examiner

Primary Examiner—Daniel D. Chang
(74) Attorney, Agent, or Firm—Darryl G. Walker; Bradley T. Sako

(57) ABSTRACT

A semiconductor apparatus including programmability that may allow a SSTL interface or LVTTL interface is provided. A reference configuration circuit (100) may provide a primary reference potential VREF0 and secondary reference potential VREF. Reference configuration circuit (100) may include a bond pad (PAD1), a reference potential generation circuit (1), a control circuit (50), a reference selection circuit (60), and a secondary reference potential generation circuit (70). During a wafer test mode, primary reference potential VREF0 and secondary reference potential VREF may be provided from a potential that may be applied to bond pad (PAD1).

20 Claims, 11 Drawing Sheets

SEMICONDUCTOR APPARATUS

TECHNICAL FIELD

The present invention relates generally to a semiconductor apparatus having a plurality of operational conditions and more particularly to the testing of the semiconductor apparatus under various operating conditions.

BACKGROUND OF THE INVENTION

A semiconductor memory device, such as a dynamic random access memory (DRAM) is typically tested at the end of the wafer processing steps. Various tests are performed. Such tests include a redundancy test for identifying defective cells and a reference potential test for checking the internally generated reference potentials. After the tests are performed, on-chip fuses may be programmed to use redundant circuits for replacing defective memory cells or for adjusting internally generated reference potentials. The on-chip fuses may be programmed by using a laser to blow selected fuses, thus selectively creating open fuses and intact (unblown) fuses.

After the fuses have been programmed, wafer testing is repeated to check whether the repaired chips properly function under different operating conditions. Functional devices are then assembled, re-tested and shipped to customers.

Depending on the system that the semiconductor device is to be used in, the signal input interface specifications (signals from an external bus onto an input pin of the semiconductor device) can differ. Two typical interface specifications are low voltage transistor-transistor logic (LVTTL) and stub series terminated logic (SSTL).

In LVTTL mode, the input signal specifications are that a high logic level ($V_{IH}$) is 2.0 volts and a low logic level ($V_{IL}$) is 0.8 volts. Thus, a signal that is 2.0 volts or higher is to be detected as logic high and a signal that is 0.8 volts or lower is detected as logic low. The bus frequency in LVTTL mode can be 100 MHz and the pulse width of the reference clock signal is 10 ns.

SSTL specifications require a higher degree of precision than LVTTL specifications. Thus, the reference voltage used to evaluate whether an input signal is high or low is applied externally to the chip. $V_{IH}$ is then defined as a potential that is 0.3 volts above the reference voltage. $V_{IL}$ is defined as a potential that is 0.3 volts below the reference voltage. Thus, a signal that is 0.3 volts or more above the reference potential is to be detected as logic high and a signal that is 0.3 volts or more lower than the reference potential is detected as logic low. The bus frequency in SSTL mode can be 133 MHz and the pulse width of the reference clock signal is 7.5 ns.

To facilitate manufacturing in a DRAM, a wire bonding option can be used to designate a device to be either a LVTTL interface device or a SSTL interface device. Thus, both a LVTTL interface device or a SSTL interface device can be manufactured with the same mask set, but can be selectively designated during the bonding process at the end of manufacturing. In this way, dedicated bond pads can be wired to different potentials to designate between LVTTL and SSTL interface.

Referring now to FIG. 12, a circuit schematic diagram of a conventional bond option circuit is set forth and given the general reference character 1200.

Conventional bond option circuit 1200 includes a reference potential generation circuit 101, transfer gates (G101 and G102), inverter IV101, resistors (R101 and R102), n-type insulated gate field effect transistor (IGFET) N103, and bond pads (PAD11 and PAD12). Bond pad PAD11 is connected to an input of inverter IV101 and an input of transfer gate G102. Transfer gate G102 has control inputs connected to bond pad PAD11 and the output of inverter IV101. Transfer gate G102 has an n-type IGFET N102 and a p-type IGFET P102. Reference potential generation circuit 101 has an output connected to an input of transfer gate G101. Transfer gate G101 has control inputs connected to bond pad PAD11 and the output of inverter IV101. Transfer gate G101 has an n-type IGFET N101 and a p-type IGFET P101. Outputs of transfer gates (G101 and G102) are commonly connected to provide primary reference potential VREF0. Resistor R101 has one terminal connected to primary reference potential VREF0 and another terminal connected to a drain of n-type IGFET N103. Resistor R102 has one terminal connected to the drain of n-type IGFET N103 and another terminal connected to VSS. N-type IGFET has a source connected to secondary reference potential VREF and a gate connected to receive a control signal C1.

The operation of conventional bond option circuit 1200 will now be described.

When bond pad PAD11 has a logic low (VSS) potential applied, transfer gate G101 is turned on and transfer gate G102 is turned off. In this way, primary reference potential VREF0 becomes the potential generated by reference potential generation circuit 101. If bond pad PAD11 has a logic high potential, transfer gate G101 is turned off and transfer gate G102 is turned on. In this way, primary reference potential VREF0 becomes the potential applied to bond pad PAD11.

When control signal C1 is high, secondary reference potential VREF is a potential determined by the ratio resistors (R101 and R102), which form a voltage divider circuit, and the potential of primary reference potential VREF. During this time, no external source should be applied to pad PAD12. When control signal C1 is low, secondary reference potential VREF has a potential determined by the potential of an external source applied to pad PAD12.

Referring now to FIG. 13, a conventional semiconductor memory device is set forth in a block schematic diagram and given the general reference character 1300.

Conventional semiconductor memory device includes a voltage-down circuit 102, voltage up circuit 103, memory cell array 104, redundant cells 105, sense amplifier 106, row decoder 107, address buffer 108, command-clock buffer 109, redundancy evaluation circuit 110, fuse circuit 110a, and data I/O buffer 111.

Voltage-down circuit 102 receives primary reference potential VREF0 and generates an internal voltage VINTS that is used for the memory cell array 104, redundant cells 105 and sense amplifier 106. Primary reference potential VREF0 is 2.1 Volts. Internal voltage VINTS has a lower potential than the primary reference potential.

Voltage-up circuit 103 receives primary reference potential VREF0 and generates an internal voltage VBOOT that is used for row decoder 107. Internal voltage VBOOT has a higher potential than the primary reference potential.

Address buffer 108, command-clock buffer 109, and data I/O buffer 111 receives secondary reference potential VREF. Secondary reference potential VREF is used as in input level reference in circuits that receive externally generated signals.

Address buffer 108 receives external address signals ADD and provide internal address signals to row decoder 107 and redundancy evaluation circuit 110. Redundancy evaluation circuit 110 determines whether the received internal address signals match a defective address (based on a programmed state of fuse circuit 110*a*). If so, the row decoder 107 is disabled and a row of redundant cells is selected from redundant cells 105. If not, the row decoder 107 is enabled and a row of memory cells is selected from memory cell array 104.

Command-clock buffer 109 receives a column address strobe signal CAS, write-enable signal WE, chip-select signal CS, and clock signal CLK. Command-clock buffer 109 provides control for read/write operations from/to memory cell array 104.

Sense amplifier 106 senses data from a selected row of memory cells and data I/O buffer 111 provides a read/write circuitry to provide data to or receive data from external data pins DQ.

Referring now to FIG. 14, a circuit diagram of an input buffer is set forth and designated by the general reference character 1400. Input buffer 1400 can correspond to input buffers that receive external signals in address buffer 108, command-clock decoder 109, or data I/O buffer 111.

Input buffer 1400 includes p-type IGFETs (P11 and P12) and n-type IGFETs (N11 and N12). N-type IGFETs N11 and N12) are input devices and p-type IGFETs (P11 and P12) are load devices. P-type IGFET P11 has a source connected to supply potential VDD, and a drain and gate connected to a drain of n-type IGFET N11. P-type IGFET P12 has a source connected to supply potential VDD, a drain connected to a drain of n-type IGFET N11, and a gate connected to the gate of p-type IGFET P11. N-type IGFET N11 has a gate connected to receive secondary reference potential VREF and a source connected to supply potential VSS. N-type IGFET N12 has a gate connected to receive an input signal IN and a source connected to supply potential VSS.

Input buffer 1400 operates as a comparator. If the potential of input signal IN is less than secondary reference potential VREF, n-type transistor N11 is turned on harder than n-type transistor N12 and output signal OUT is high. If the potential of input signal IN is higher than secondary reference potential VREF, n-type transistor N12 is turned on harder than n-type transistor N11 and output signal OUT is low. In this way input buffer 1400 acts as an inverting input buffer in that output signal OUT is inverted with respect to input signal IN. Input buffer 1400 is a differential amplifier and can detect small differences in potential between input signal IN and secondary reference potential VREF.

Referring to FIGS. 12, 13, and 14, in a conventional semiconductor device 1300 incorporating conventional bond option circuit 1200 and input buffer 1400, the device is tested at the end of the manufacturing process and before packaging. Such a wafer testing procedure is carried out by applying a potential of 2.1 volts to bond pad PAD11 of bond option circuit. With a potential of 2.1 volts applied to bond pad PAD11, pass gate G102 is turned on and pass gate G101 is turned off. The 2.1 volts applied to bond pad PAD11 provides the primary reference voltage VREF0. Control signal C1 is high and the secondary reference potential VREF becomes a potential that is proportional to primary reference voltage VREF0 based on the values of resistors (R101 and R102).

An external potential is applied for testing because the potential provided by reference potential generation circuit 101 can vary among wafers that are processed in different batches or lots. In this way, the test results can be compared with results obtained when reference potential generation circuit 101 generates primary reference voltage VREF0.

After wafer testing, the device is programmed to operate in either LVTTL mode or SSTL mode. If the device is programmed to operate in LVTTL mode, bond pad PAD11 is bonded to supply potential VSS, control signal C1 is set at a high potential and bond pad PAD12 is left to float. In this way, pass gate G102 is turned off and pass gate G101 is turned on. Reference potential generation circuit 101 provides primary reference potential VREF0. N-type IGFET N103 is turned on. Secondary reference potential VREF is proportional to primary reference potential VREF0 based on the values of resistors (R101 and R102).

If the device is programmed to operate in SSTL mode, bond pad PAD11 is bonded to supply potential VSS, control signal C1 is set at a low potential (VSS) and bond pad PAD12 is bonded to an external pin for receiving a reference potential. In this way, pass gate G102 is turned off and pass gate G101 is turned on. Reference potential generation circuit 101 provides primary reference potential VREF0. N-type IGFET N103 is turned off. Secondary reference potential VREF is equal to the externally applied reference potential receive at bond pad PAD12. The potential externally applied to bond pad PAD12 is 1.5 volts.

Referring to FIG. 14, the secondary reference potential VREF is generated internally when in the LVTTL mode and externally when in the SSTL mode. In both modes it is desirable to set the secondary reference potential at a midpoint between $V_{IH}$ and $V_{IL}$. This will give the maximum differential potential for input buffer 1400 to detect and will allow faster circuit operation and more reliable input noise margins.

As illustrated in the conventional semiconductor memory device 1300, a separate bond pad PAD11 is needed to allow the primary and secondary reference potentials (VREF0 and VREF) to be tested. In the normal mode of operation bond pad PAD12 is used to provide secondary reference potential VREF for SSTL mode operation.

As a semiconductor memory devices get smaller, fewer bond pads are available that can be dedicated for bond options and testing. This is particularly true among devices having a wide DQ configuration as is typical among present day DRAMs.

In the conventional bond option circuit 1200 in FIG. 12, a separate bond pad may be required to provide the potential on the control gate of N-type IGFET N103 in LVTTL mode and SSTL mode devices.

Also, if the primary reference potential VREF0 supplied during the wafer test shifts, internal circuits that receive potentials based on the primary reference potential may not function correctly. Transfer gates (G101 and G102) include p-type IGFETs that may have p-n junctions forward biased when a reference potential is applied to bond pad PAD11 during testing. This can cause latch-up to occur by turning on parasitic bipolar transistors and my lead to the destruction of the device under test.

Also, when testing the secondary reference potential VREF, control signal C1 must be high. However, when switching back to a normal mode of operation, control signal C1 must become low. If the switching of control signal C1 is provided by an input buffer, then there may be problems with affecting the secondary reference potential while switching control signal C1 and this may affect the difference between an input logic value and secondary reference potential so that input buffers may incorrectly evaluate received signals.

In view of the above discussion, it would be desirable to provide a semiconductor memory device with a reduced number of bond pads while still providing an accurate method of testing reference potentials and circuit operation. It would also be desirable to test a semiconductor device having two different input interfaces that may be selected during the manufacturing phase of the device.

SUMMARY OF THE INVENTION

According to the present embodiments, a semiconductor device can include a reference configuration circuit. The reference configuration circuit may provide a primary reference potential VREF0 and secondary reference potential. During a wafer test mode, primary reference potential VREF0 and secondary reference potential VREF may be provided from a potential that may be applied to a bond pad.

According to one aspect of the embodiments, the reference configuration circuit may include a bond pad, a reference potential generation circuit, a control circuit, a reference selection circuit, and a secondary reference potential generation circuit.

According to one another aspect of the embodiments, the second reference potential may be an input buffer reference potential.

According to another aspect of the embodiments, the semiconductor device may be programmably configured to operate in a first operational mode or a second operational mode.

According to another aspect of the embodiments, the reference configuration circuit may include a second reference potential generator receiving the first reference potential. In a normal operation, when the semiconductor device may be configured to operate in the first operational mode, the first reference potential may be generated by the first reference potential generator. When the semiconductor device is configured to operate in the second operational mode, the second reference potential may be generated by the second reference potential generator.

According to another aspect of the embodiments, in the test mode of operation, the second reference potential may be generated by the second reference potential generator.

According to another aspect of the embodiments, the reference configuration circuit can include a fuse that may be intact in the test mode of operation and blown in the first operational mode.

According to another aspect of the embodiments, a control circuit may provide a first control signal having a first logic level in a normal operation and a second logic level in a test operation. A reference selection circuit may receive the control signal and provide a first reference potential at a first node and a second reference potential at a second node. In the normal operation, the selection circuit may provide a potential received on the bond pad to the second node an in a test operation the selection circuit may provide the potential received on the bond pad to the first node.

According to another aspect of the embodiments, the control circuit may include a programmable device having a first state in the test operation and a second state in the normal operation.

According to another aspect of the embodiments, the reference selection circuit may include a first switch including a voltage translator that may receive the first control signal and may provide a switch control output to a control gate of a controllable impedance device that may be connected between the bond pad and the first node.

According to another aspect of the embodiments, the reference configuration may include a reference potential generation circuit coupled to the reference selection circuit. The reference selection circuit may include a second switch that may receive the first control signal and may provide a low impedance path between the reference potential generation circuit and the first node when the first control signal has the first logic level and a high impedance path between the reference potential generation circuit and the first node when the first control signal has the second logic level.

According to another aspect of the embodiments, the reference selection circuit may include a switch that may be connected to receive the first control signal and may provide a low impedance path between the second reference potential generation circuit and the second node when the first control signal has the first logic level and a high impedance path between the reference potential generation circuit and the second node when the first control signal has the second logic level.

According to another aspect of the embodiments, the second reference potential generation circuit may receive the first reference potential and generate a potential that may be proportional to the first reference potential.

According to another aspect of the embodiments, the control circuit may receive a power-up signal that may force the first control signal to the second logic level during power-up.

According to another aspect of the embodiments, the semiconductor device may be programmably configured to operate in a first operational mode that may have first input signal specifications or a second operational mode that may have second input signal specifications.

According to another aspect of the embodiments, the first reference generation circuit may include at least one programmable device for adjusting the potential provided.

According to another aspect of the embodiments, the semiconductor device may include a voltage-down circuit that may receive the first reference potential and may provide an internal supply potential having a potential less than the first reference potential.

According to another aspect of the embodiments, the semiconductor device may include a voltage-up circuit that may receive the first reference potential and may provide an internal supply potential having a potential greater than the first reference potential.

According to another aspect of the embodiments, the semiconductor device may be a semiconductor memory device. The first operational mode may be a SSTL mode and the second operational mode may be a LVTTL mode.

According to another aspect of the embodiments, a method for testing a semiconductor device during a wafer test mode, a primary reference potential VREF0 and a secondary reference potential VREF may be provided from a potential that may be applied to a bond pad. A reference generation circuit may be included on the semiconductor device and may generate a reference potential. The reference generation circuit may include at least one programmable device for adjusting the reference potential.

According to another aspect of the embodiments, the method for testing the semiconductor device may include cutting a fuse after testing the semiconductor device.

DETAILED DESCRIPTION OF THE EMBODIMENTS

Various embodiments of the present invention will now be described in detail with reference to a number of drawings.

Figure 1:
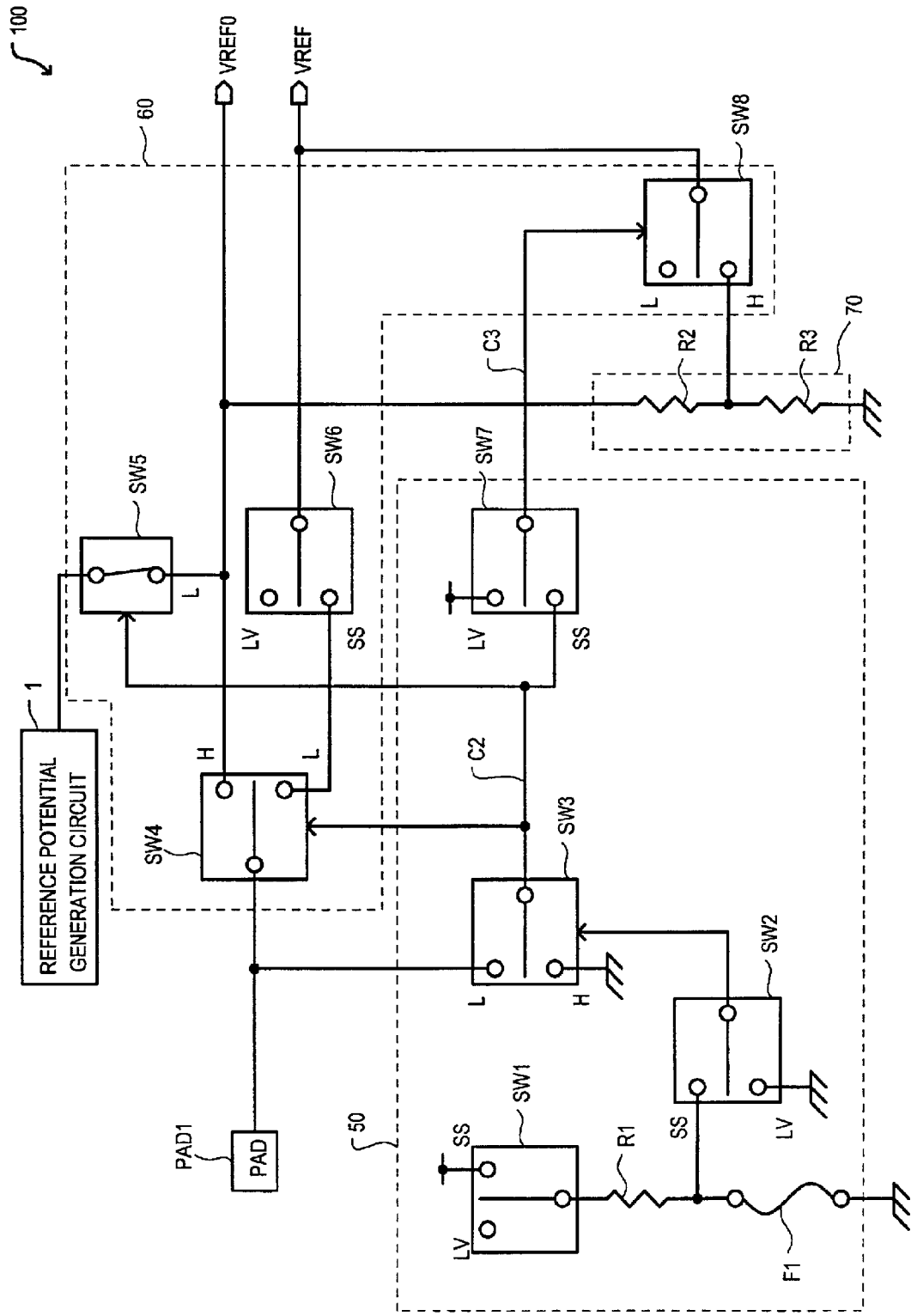
FIG. 1 is a circuit schematic diagram of a reference configuration circuit according to an embodiment.

Referring now to FIG. 1, a circuit schematic diagram of a reference configuration circuit according to an embodiment is set forth and given the general reference character 100.

Reference configuration circuit 100 can include, a bond pad PAD1, a reference potential generation circuit 1, a control circuit 50, a reference selection circuit 60, and a secondary reference potential generation circuit 70. Reference configuration circuit 100 may receive an input signal from bond pad PAD1 and may provide a primary reference potential VREF0 and a secondary reference potential VREF.

Reference configuration circuit 100 may provide a primary reference potential VREF0 and a secondary reference potential VREF determined by a mode of operation of a semiconductor device and a potential that may be applied to bond pad PAD1. A semiconductor device incorporating reference configuration circuit 100 may include a LVTTL mode of operation and a SSTL mode of operation. The modes of operation may be selected during the manufacturing process. Also, a test mode may be included that can allow a semiconductor device to be tested using the reference configuration circuit 100.

Bond pad PAD1 may be provided as an input to control circuit 50 and reference selection circuit 60. Control circuit 50 can provide control signals (C2 and C3) to reference selection circuit 60. Reference selection circuit 60 can receive a reference potential from secondary reference potential generation circuit 70 and a reference potential from reference potential generation circuit 1. Reference selection circuit may provide a primary reference potential VREF0 and a secondary reference potential VREF.

Control circuit 50 can include switches (SW1, SW2, SW3, and SW7), a resistor R1, and a fuse F1. Switch SW1 can selectively apply a potential to resistor R1 based on a mode of operation (LVTTL mode or SSTL mode). Resistor R1 may have a terminal connected to fuse F1 and an input of switch SW2. Fuse F1 may be connected between resistor R1 and a ground potential VSS. Switch SW2 may selectively apply a potential provided by a node connection of resistor R1 and fuse F1 to an input of switch SW3. Switch SW3 may receive a potential from pad PAD1 and selectively provide a control signal C2 to reference selection circuit 120. Switch SW7 may apply a control signal C3 to switch SW8. Switch SW8 may receive a reference potential from secondary reference potential generation circuit 70 and may selectively provide secondary reference potential VREF based on a mode of operation.

Reference selection circuit 60 can include switches (SW4, SW5, SW6, and SW8). Switch SW4 can be connected to bond pad PAD1 and may selectively connect bond pad PAD1 to primary reference potential VREF0 or an input to switch SW6 based on the logic level of control signal C2. When control signal has a high logic level, switch SW4 may connect pad PAD1 to primary reference potential VREF0. When control signal C2 has a low logic level, switch SW4 may connect bond pad PAD1 to an input of switch SW6. Switch SW5 can selectively connect a reference potential from reference potential generation circuit 1 to primary reference potential VREF0 based on the logic level of control signal C2. When control signal C2 has a low logic level, switch SW5 may be in a closed position. When control signal C2 has a high logic level, switch SW5 may be in an open position. Switch SW6 may connect secondary reference VREF to switch SW4 in one mode of operation and may provide an open circuit in another mode of operation. Switch SW8 may connect a reference potential from secondary reference potential generation circuit to secondary reference potential VREF based on a logic level of control signal C3. When control signal C3 has a high logic level, switch SW8 may connect a reference potential from secondary reference potential generation circuit to secondary reference potential VREF.

Secondary reference potential generation circuit 70 can include resistors (R2 and R3). Resistor R2 may have a terminal connected to primary reference potential VREF0 and another terminal connected to a terminal of resistor R3 and an input to switch SW8. Resistor R3 may have another terminal connected to ground potential VSS.

Switches (SW1, SW2, SW6, and SW7) may have an SS connection and an LV connection. When the semiconductor device is to operate in the SSTL mode, switches (SW1, SW2, SW6, and SW7) may be programmed to connect to the SS connection. When the semiconductor device is to operate in the LVTL mode, switches (SW1, SW2, SW6, and SW7) may be programmed to connect to the LV connection. Switches (SW1, SW2, SW6, and SW7) may be programmable metal mask options, as just one example.

Figure 2:
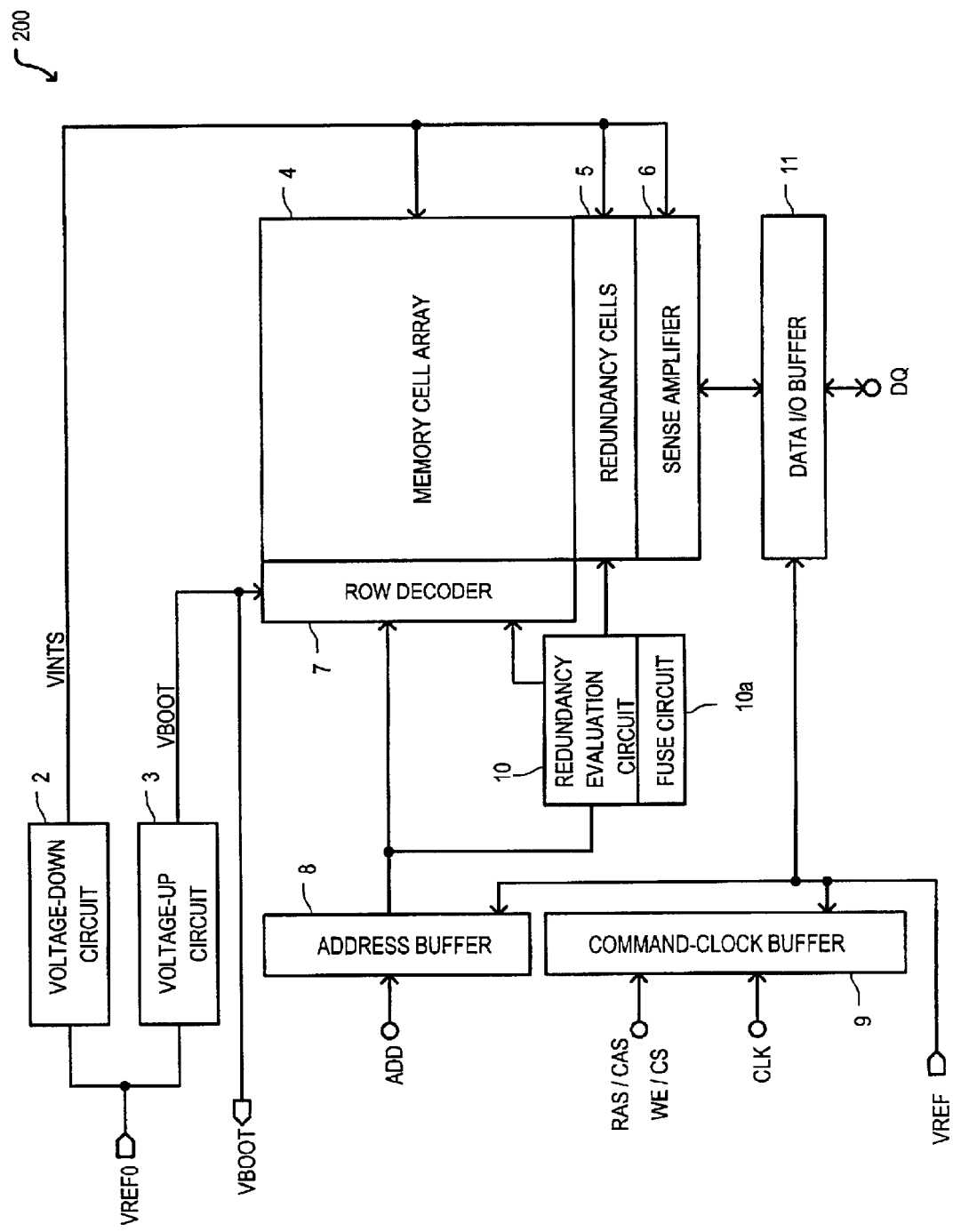
FIG. 2 is a block schematic diagram of a semiconductor memory device according to one embodiment.

Referring now to FIG. 2, a semiconductor memory device according to one embodiment is set forth in a block schematic diagram in given the general reference character 200.

Semiconductor memory device 200 can include the reference configuration circuit 100 of FIG. 1 (not illustrated in FIG. 2). Semiconductor memory device 200 may include a voltage-down circuit 2, voltage up circuit 3, memory cell array 4, redundant cells 5, sense amplifier 6, row decoder 7, address buffer 8, command-clock buffer 9, redundancy evaluation circuit 10, fuse circuit 10a, and data I/O buffer 11.

Voltage-down circuit 2 may receive primary reference potential VREF0 (from reference configuration circuit 100 of FIG. 1) and generate an internal voltage VINTS that may be used for the memory cell array 4, redundant cells 5, and sense amplifier 6. Primary reference potential VREF0 may be 2.1 Volts, as just one example. Internal voltage VINTS may have a lower potential than the primary reference potential.

Voltage-up circuit 3 may receive primary reference potential VREF0 (from reference configuration circuit 100 of FIG. 1) and generate an internal voltage VBOOT that is used for row decoder 7. Internal voltage VBOOT can have a higher potential than the primary reference potential. Voltage-up circuit 3 may also provide internal voltage VBOOT to reference configuration circuit 100 of FIG. 1.

Address buffer 8, command-clock buffer 9, and data I/O buffer 11 may receive secondary reference potential VREF. Secondary reference potential VREF may be used as in input level reference in circuits that receive externally generated signals.

Address buffer 8 may receive external address signals ADD and provide internal address signals to row decoder 7 and redundancy evaluation circuit 10. Redundancy evaluation circuit 10 may determine whether the received internal address signals match a defective address (based on a programmed state of fuse circuit 10a). If so, the row decoder 7 may be disabled and a row of redundant cells may be selected from redundant cells 5. If not, the row decoder 7 may be enabled and a row of memory cells may be selected from memory cell array 4.

Command-clock buffer 9 may receive a column address strobe signal CAS, write-enable signal WE, chip-select signal CS, and clock signal CLK. Command-clock buffer 9 may provide control for read/write operations from/to memory cell array 4.

Sense amplifier 6 may sense data from a selected row of memory cells and data I/O buffer 11 may provide a read/write circuitry to provide data to or receive data from external data pins DQ.

Figure 3:
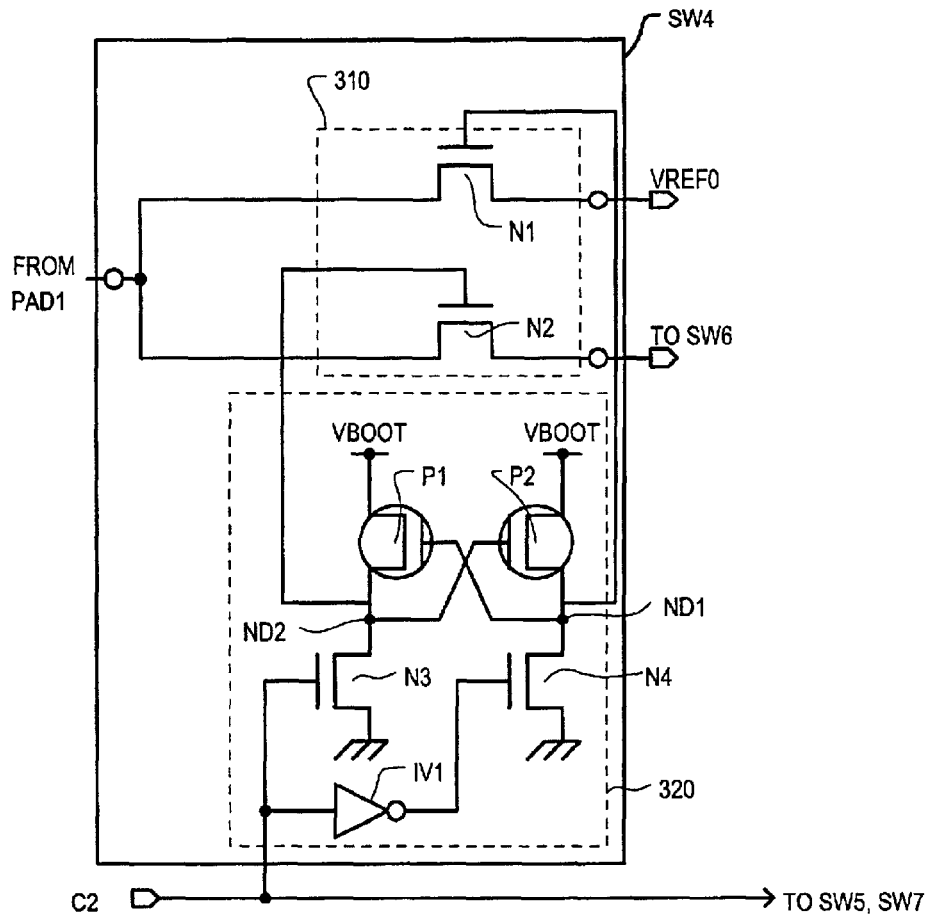
FIG. 3 is a circuit schematic of switch according to an embodiment.

Referring now to FIG. 3, a circuit schematic of switch SW4 according to an embodiment is set forth.

Switch SW4 may be electrically connected to bond pad PAD1. Switch SW4 may electrically connect bond pad PAD1 to primary reference potential VREF0 or an input to switch SW6 based on a logic level of control signal C2. Switch SW4 may include a multiplexer 310 and a voltage translator 320.

Multiplexer 310 may include n-type IGFETs (N1 and N2). N-type IGFET N1 may have a source connected to bond pad PAD1, a drain connected to primary reference potential VREF0, and a gate connected to node ND1 of voltage translator. N-type IGFET N2 may have a source connected to bond pad PAD1, a drain connected to an input of switch SW6, and a gate connected to node ND2 of voltage translator.

Voltage translator 320 may include n-type IGFETs (N3 and N4), p-type IGFETs (P1 and P2), and an inverter IV1. N-type IGFET N3 may have a source connected to ground potential VSS, a drain connected to node ND2 and a gate connected to receive control signal C2. N-type IGFET N4 may have a source connected to ground potential VSS, a drain connected to node ND2 and a gate connected to receive control signal C2 through inverter IV1. P-type IGFET P1 may have a source connected to internal voltage VBOOT, a drain connected to node ND2 and a gate connected to node ND1. P-type IGFET P2 may have a source connected to internal voltage VBOOT, a drain connected to node ND1 and a gate connected to node ND2. P-type IGFETs (P1 and P2) may be cross-coupled.

Depending on the logic level of control signal C2, voltage translator 320 may provide internal voltage VBOOT to either node ND1 or node ND2. Internal voltage VBOOT may be a boosted voltage that may have a higher potential than a potential applied to bond pad PAD1 by at least a threshold voltage of a n-channel IGFET (for example IGFETs (N1 and N2)). In this way, there may be no potential loss across n-channel IGFETs (N1 and N2) when activated.

Figure 4:
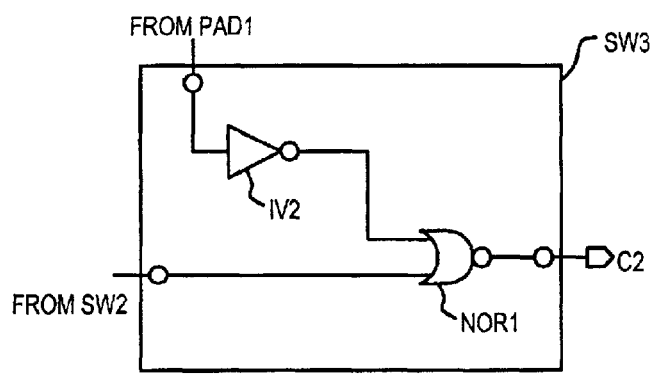
FIG. 4 is a circuit schematic of switch according to an embodiment.

Referring now to FIG. 4, a circuit schematic of switch SW3 according to an embodiment is set forth.

Switch SW3 may include an inverter IV2 and a NOR gate NOR1. Inverter IV2 may have an input connected to bond pad PAD1 and an output connected to an input of NOR gate NOR1. NOR gate NOR1 may generate control signal C2, which may be connected to switches (SW4, SW5, and SW7) of FIG. 1.

Figure 5:
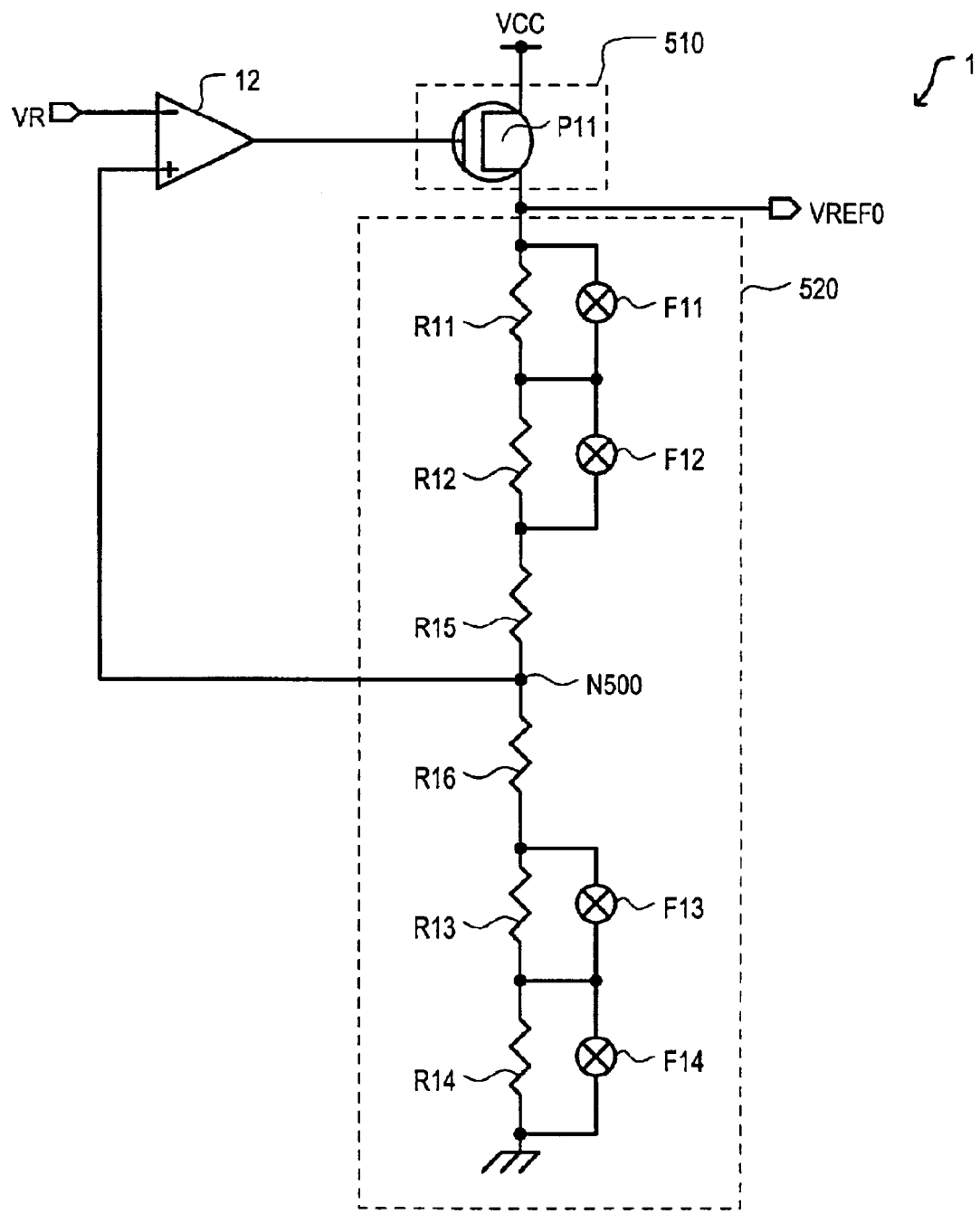
FIG. 5 is a circuit schematic diagram of reference potential generation circuit according to an embodiment.

Referring now to FIG. 5, a circuit schematic diagram of reference potential generation circuit 1 according to an embodiment is set forth.

Reference potential generation circuit 1 may be used as reference potential generation circuit 1 of FIG. 1.

Reference potential generation circuit 1 may receive a reference potential VR and may generate primary reference potential VREF0.

Reference potential generation circuit 1 may include a differential amplifier 12, a control circuit 510, and a programmable potential translation circuit 520.

Differential amplifier 12 may receive reference potential VR at a positive input terminal and a feedback node N500 at a negative input terminal and may generate a control signal.

Control circuit 510 may include a p-type IGFET P11. P-type IGFET P11 may have a source connected to power supply VCC, a drain connected to primary reference potential VREF0, and a control gate connected to receive an output of differential amplifier 12.

Programmable potential translation circuit 520 may include resistors (R11 to R16) and fuses (F11 to F14). Resistors (R11 to R12) may be connected in series between primary reference potential VREF0 and a terminal of resistor R15. Resistor R15 may have another terminal connected to feedback node N500. Resistor R16 may have a terminal connected to feedback node N500 and another terminal may be connected to a terminal of resistor R13. Resistors (R13 and R14) may be connected in series between a terminal of resistor R16 and ground potential VSS. Resistors (R11 to R14) may each have a fuse (F11 to F14) connected across, respectively. Fuses (F11 to F14) may be laser programmable fuses, as just one example.

Reference potential generation circuit 1 may receive a reference potential VR and may provide a primary reference potential VREF0 having a greater potential based on the values of resistors (R11 to R16) and the states of fuses (F11 to F14). Differential amplifier 12 may provide an output signal to the control circuit 510 so that p-type IGFET P11 may provide a current to programmable potential translation circuit 520 providing a feedback signal at feedback node N500 that has a potential approximately equal to reference potential VR. Fuses (F11 to F14) may be selectively programmed to adjust the primary reference potential VREF0 to a desired potential value. By cutting or blowing fuses (F11 and/or F12), primary reference potential VREF0 may be increased. By cutting or blowing fuses (F13 and/or F14), primary reference potential VREF0 may be decreased.

Next the configuration and operation of reference configuration circuit 100 will be described for wafer testing and normal operations for a SSTL mode and LVTTL mode of operation.

Figure 6:
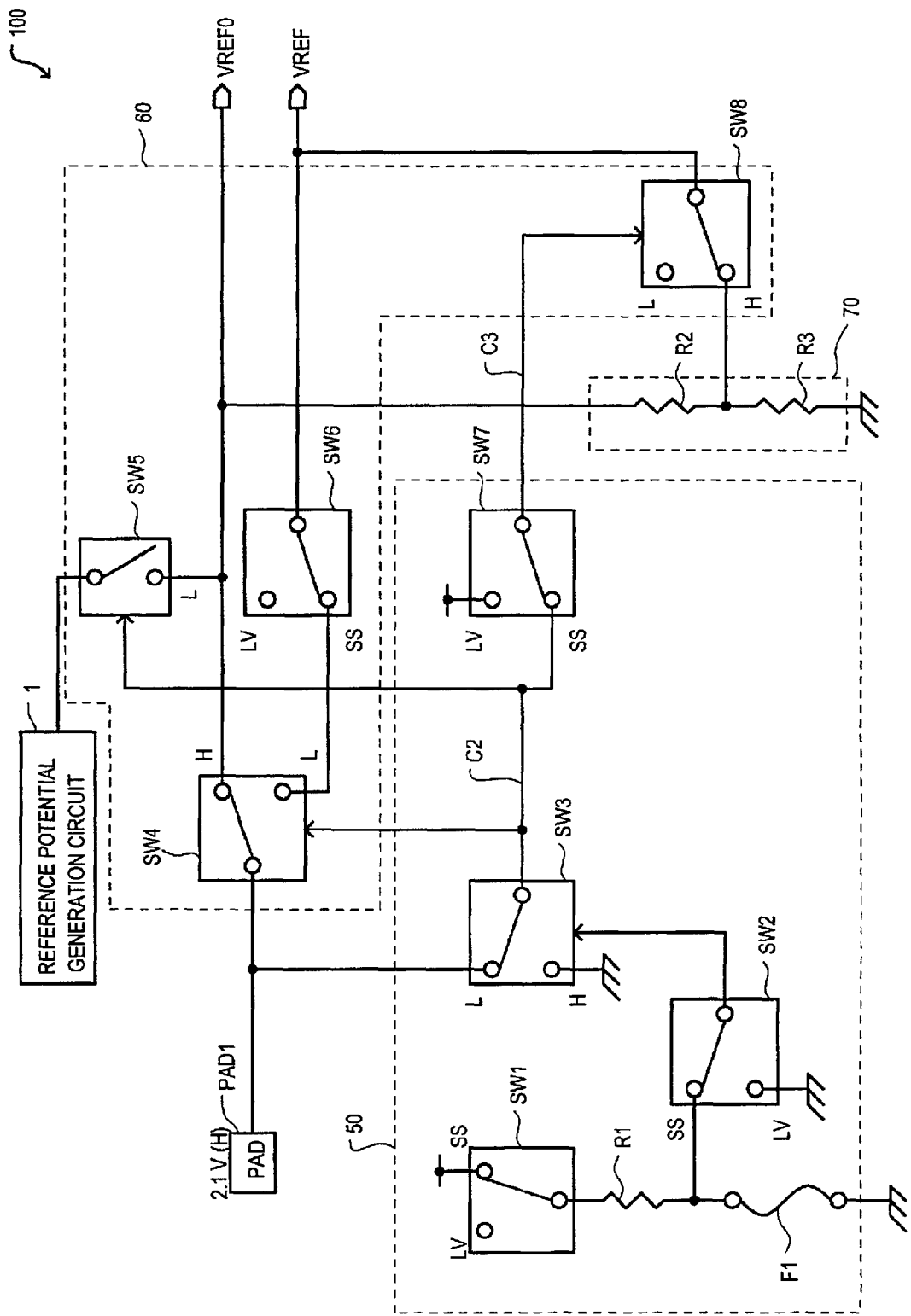
FIG. 6 is a circuit schematic diagram illustrating operating conditions of a reference configuration circuit during the wafer test operation in the SSTL mode according to an embodiment.

Referring now to FIG. 6, a circuit schematic diagram illustrating operating conditions of reference configuration circuit 100 during the wafer test operation in the SSTL mode according to an embodiment is set forth.

In the test mode of operation for a semiconductor device that may be selectively programmed (by bond options and/or metal switch options, for example) to operate using SSTL interface specifications, it may be desired to externally apply an internal supply potential and an input reference potential. As noted earlier, in the SSTL mode, the input reference potential may be applied externally through a bond pad (PAD1, for example) during normal operations. In the test mode of operation illustrated in FIG. 6, bond pad PAD1 may be used to externally apply primary reference potential VREF0. However, secondary reference potential may be generated by secondary reference potential generation circuit 70. In this way, secondary reference potential VREF may be proportional to the potential externally applied on bond pad PAD1. Thus, both primary reference potential VREF0 and secondary reference potential VREF may be externally applied during a test mode.

The test mode may be used to test input characteristics and operating margins of internal circuitry on a semiconductor device, as just two examples.

Referring now to FIG. 6, in the test mode for a semiconductor device that may be selectively programmed to operate in the SSTL mode, bond pad PAD1 may receive a potential of approximately 2.1 volts. Control circuit 50 may include fuse F1 in an intact state. Switches (SW1, SW2, and SW7) may be selectively set to select the SS input. Switch SW6 of reference selection circuit 60 may be selectively set to select the SS input.

Switch SW1 may be programmed to apply a power supply VCC to a terminal of resistor R1. However, because fuse F1 may be intact, ground potential VSS may be applied to the SS input of switch SW2. Thus, the L input of switch SW3 may be selected. Because bond pad PAD1 may receive a potential of approximately 2.1 volts, a logic high may be input to the L input of switch SW3. Thus, (referring to FIG. 4), inverter IV2 may receive a logic high input and may apply a logic low to one input of NOR gate NOR1. The other input of NOR gate NOR1 may receive a logic low from switch SW2. Thus, control signal C2 may be logic high. Referring once again to FIG. 6, the high logic level of control signal C2 may then be applied (through switch SW7) to control signal C3. Thus control signal C3 may be logic high.

With control signal C2 at logic high, switch SW5 may be in a high impedance state (an open circuit). Thus, reference potential generation circuit 1 may be disconnected from primary reference potential VREF0. Control signal C2 may be applied to switch SW4. With control signal C2 at a logic high (referring to FIG. 3), n-type IGFET N3 may be turned on and n-type IGFET N4 may be turned off. Node ND2 may be pulled low. Thus, p-type IGFET P2 may be turned on and node ND1 may be pulled to internal voltage VBOOT. N-type IGFET N2 may be turned off and n-type IGFET N1 may be turned on. With n-type IGFET N1 receiving internal voltage VBOOT at a control gate, the potential (approximately 2.1 volts) applied to bond pad PAD1 may be applied to primary reference potential VREF0 with essentially no drop in potential. Thus, the potential of primary reference potential VREF0 may be essentially the same as the potential applied to bond pad PAD11.

Primary reference potential VREF0 may be input to secondary reference potential generation circuit 70. Secondary reference potential generation circuit may generate a potential that is proportional to primary reference potential VREF0 as determined by a ratio of resistors (R2 and R3). Because control signal C3 is logic high, the potential generated by secondary reference potential generation circuit 70 may be applied to secondary reference potential VREF.

In this way, both primary reference potential VREF0 and secondary reference potential VREF may be externally applied during a test mode. It is noted that only a single bond pad PAD1 may be used to externally apply both primary reference potential VREF0 and secondary reference potential VREF.

Figure 7:
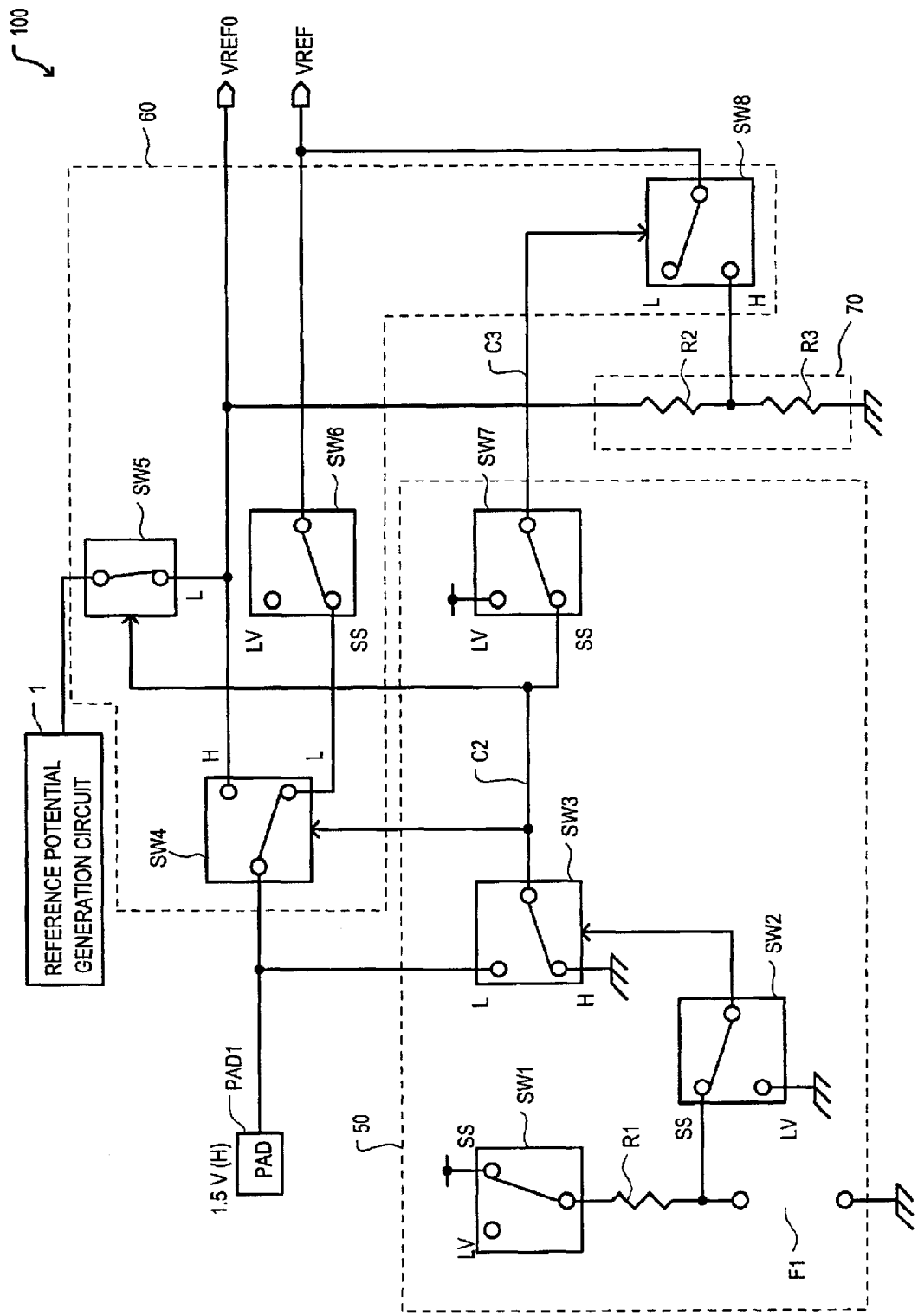
FIG. 7 is a circuit schematic diagram illustrating operating conditions of a reference configuration circuit during normal operation in the SSTL mode according to an embodiment.

Referring now to FIG. 7, a circuit schematic diagram illustrating operating conditions of reference configuration circuit 100 during normal operation in the SSTL mode according to an embodiment is set forth.

In the SSTL mode, the secondary reference potential VREF may be applied externally through a bond pad (PAD1, for example) during normal operation. Primary reference potential VREF0 may be internally generated by reference potential generation circuit 1.

Referring now to FIG. 7, in the normal mode for a semiconductor device that may be selectively programmed to operate in the SSTL mode, bond pad PAD1 may receive a potential of approximately 1.5 volts. Control circuit 50 may include fuse F1 in a cut or blown state. Switches (SW1, SW2, and SW7) may be selectively set to select the SS input. Switch SW6 of reference selection circuit 60 may be selectively set to select the SS input.

Switch SW1 may be programmed to apply a power supply VCC to a terminal of resistor R1. Because fuse F1 may be cut or blown, power supply VCC may be applied to the SS input of switch SW2. Therefore, the H input of switch SW3 may be selected. Thus, (referring to FIG. 4), an input of NOR gate NOR1 may receive a logic high (VCC) from switch SW2. Thus, control signal C2 may be logic low. Referring once again to FIG. 7, the low logic level of control signal C2 may then be applied (through switch SW7) to control signal C3. Thus control signal C3 may be logic low.

With control signal C2 at logic low, switch SW5 may be in a low impedance state (a closed position). Thus, reference potential generation circuit 1 may be connected to generate primary reference potential VREF0. Control signal C2 may be applied to switch SW4. With control signal C2 at a logic low (referring to FIG. 3), n-type IGFET N3 may be turned off and n-type IGFET N4 may be turned on. Node ND1 may be pulled low. Thus, p-type IGFET P1 may be turned on and node ND2 may be pulled to internal voltage VBOOT. N-type IGFET N1 may be turned off and n-type IGFET N2 may be turned on. With n-type IGFET N2 receiving internal voltage VBOOT at a control gate, the potential (approximately 1.5 volts) applied to bond pad PAD1 may be applied to secondary reference potential VREF with essentially no drop in potential. Thus, the potential of secondary reference potential VREF may be essentially the same as the potential applied to bond pad PAD1. Primary reference potential VREF0 may be input to secondary reference potential generation circuit 70. Secondary reference potential generation circuit 70 may generate a potential that is proportional to primary reference potential VREF0 as determined by a ratio of resistors (R2 and R3). However, because control signal C3 is logic low, switch SW8 may be in an open state and the secondary reference potential generation circuit 70 may be disconnected from secondary reference potential VREF.

In this way, secondary reference potential VREF may be externally applied on bond pad PAD1 during a normal operation in SSTL mode. It is noted that only a single bond pad PAD1 may be used to externally apply both primary reference potential VREF0 and secondary reference potential VREF during the test mode and the same bond pad PAD1 may be used to apply secondary reference potential VREF during the normal operation. Thus, chip area may be reduced.

Figure 8:
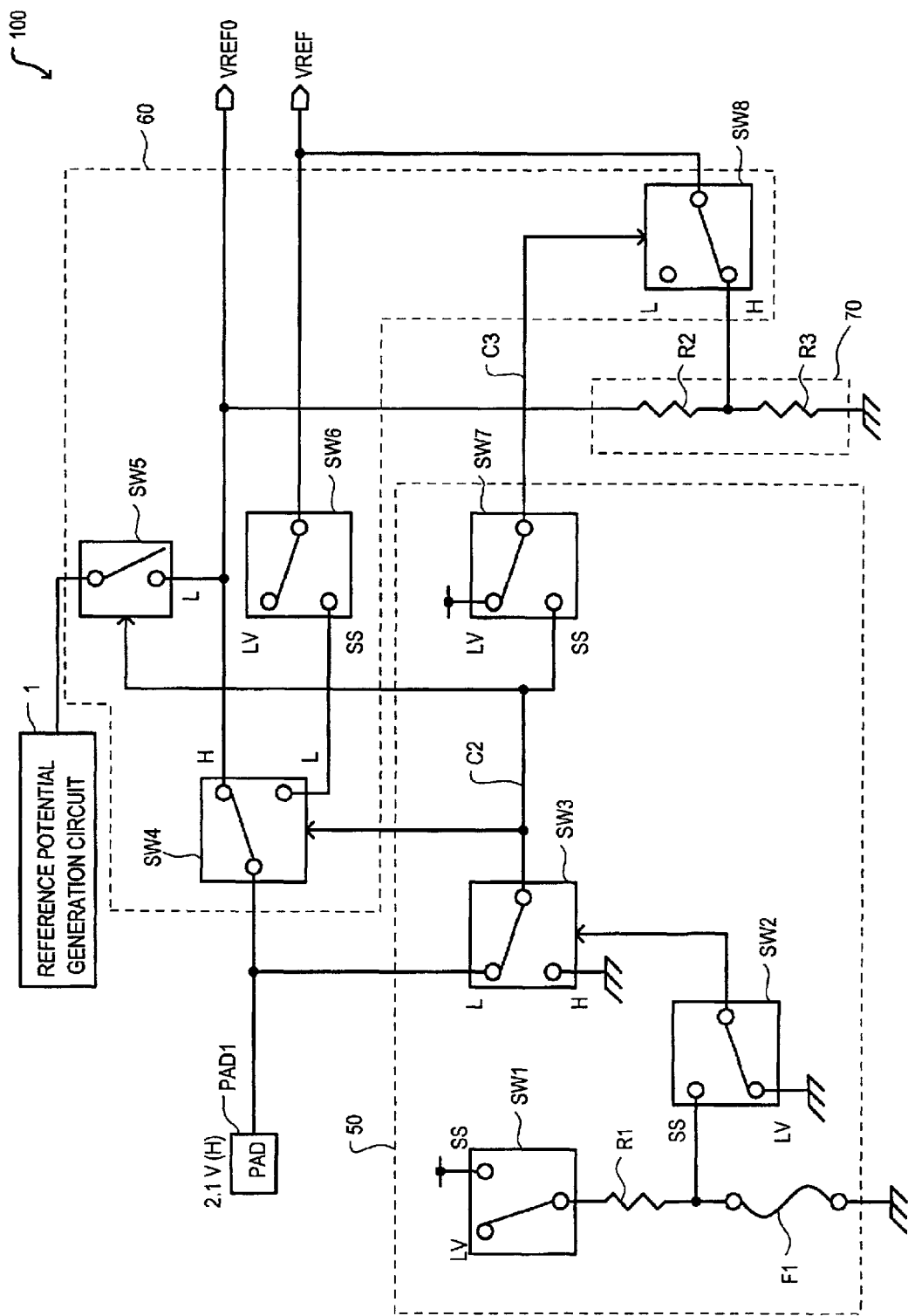
FIG. 8 is a circuit schematic diagram illustrating operating conditions of a reference configuration circuit during the wafer test operation in the LVTTL mode according to an embodiment.

Referring now to FIG. 8, a circuit schematic diagram illustrating operating conditions of reference configuration circuit 100 during the wafer test operation in the LVTTL mode according to an embodiment is set forth.

In the test mode of operation for a semiconductor device that may be selectively programmed (by bond options and/or metal switch options, for example) to operate using LVTTL interface specifications, it may be desired to externally apply an internal supply potential and an input reference potential. As noted earlier, in the LVTTL mode, the input reference potential and internal supply potentials may be internally generated during normal operations. In the test mode of operation illustrated in FIG. 8, bond pad PAD1 may be used to externally apply primary reference potential VREF0. However, secondary reference potential may be generated by secondary reference potential generation circuit 70. In this way, secondary reference potential VREF may be proportional to the potential externally applied on bond pad PAD1. Thus, both primary reference potential VREF0 and secondary reference potential VREF may be externally applied during a test mode.

The test mode may be used to test input characteristics and operating margins of internal circuitry on a semiconductor device, as just two examples.

Referring now to FIG. 8, in the test mode for a semiconductor device that may be selectively programmed to operate in the LVTTL mode, bond pad PAD1 may receive a potential of approximately 2.1 volts. Control circuit 50 may include fuse F1 in an intact state. Switches (SW1, SW2, and SW7) may be selectively set to select the LV input. Switch SW6 of reference selection circuit 60 may be selectively set to select the LV input.

Switch SW1 may be programmed to an open circuit condition. Because switch SW2 may be programmed to select the LV input, a ground potential VSS may be applied to switch SW3. Thus, the L input of switch SW3 may be selected. Because bond pad PAD1 may receive a potential of approximately 2.1 volts, logic high may be input to the L input of switch SW3. Thus, (referring to FIG. 4), inverter IV2 may receive a logic high input and may apply logic low to one input of NOR gate NOR1. The other input of NOR gate NOR1 may receive a logic low from switch SW2. Thus, control signal C2 may be logic high. Referring once again to FIG. 8, because switch SW7 may be programmed to select the LV input, power supply VCC may be applied to control signal C3. Thus control signal C3 may be logic high.

With control signal C2 at logic high, switch SW5 may be in a high impedance state (an open circuit). Thus, reference potential generation circuit 1 may be disconnected from primary reference potential VREF0. Control signal C2 may be applied to switch SW4. With control signal C2 at a logic high (referring to FIG. 3), n-type IGFET N3 may be turned on and n-type IGFET N4 may be turned off. Node ND2 may be pulled low. Thus, p-type IGFET P2 may be turned on and node ND1 may be pulled to internal voltage VBOOT. N-type IGFET N2 may be turned off and n-type IGFET N1 may be turned on. With n-type IGFET N1 receiving internal voltage VBOOT at a control gate, the potential (approximately 2.1 volts) applied to bond pad PAD1 may be applied to primary reference potential VREF0 with essentially no drop in potential. Thus, the potential of primary reference potential VREF0 may be essentially the same as the potential applied to bond pad PAD1.

Primary reference potential VREF0 may be input to secondary reference potential generation circuit 70. Secondary reference potential generation circuit may generate a potential that is proportional to primary reference potential VREF0 as determined by a ratio of resistors (R2 and R3). Because control signal C3 is logic high, the potential generated by secondary reference potential generation circuit 70 may be applied to secondary reference potential VREF.

In this way, both primary reference potential VREF0 and secondary reference potential VREF may be externally applied during a test mode. It is noted that only a single bond pad PAD1 may be used to externally apply both primary reference potential VREF0 and secondary reference potential VREF.

Figure 9:
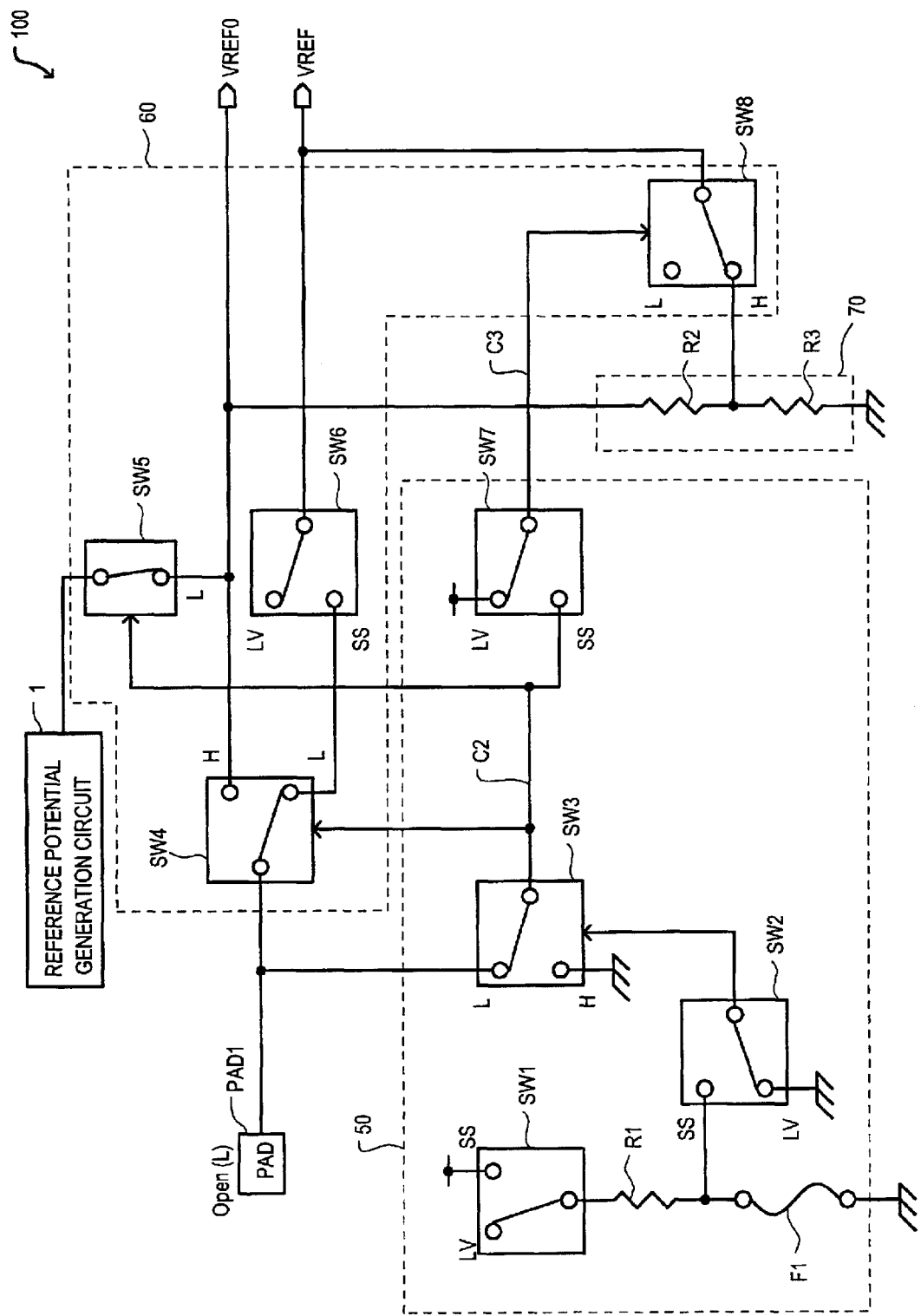
FIG. 9 is a circuit schematic diagram illustrating operating conditions of a reference configuration circuit during the normal operation in the LVTTL mode according to an embodiment.

Referring now to FIG. 9, a circuit schematic diagram illustrating operating conditions of reference configuration circuit 100 during the normal operation in the LVTTL mode according to an embodiment is set forth.

In the normal operation for a semiconductor device that may be selectively programmed to operate in the LVTTL mode, bond pad PAD1 may be bonded to a low logic potential. Alternatively, bond pad PAD1 may be left open and internal circuitry (not shown) may force bond pad PAD1 to a low logic potential during power up and the low logic potential may be latched thereafter. Control circuit 50 may include fuse F1 in an intact state. Switches (SW1, SW2, and SW7) may be selectively set to select the LV input. Switch SW6 of reference selection circuit 60 may be selectively set to select the LV input.

Switch SW1 may be programmed to an open circuit condition. Because switch SW2 may be programmed to select the LV input, a ground potential VSS may be applied to switch SW3. Thus, the L input of switch SW3 may be selected. Because bond pad PAD1 may receive a low logic potential, logic low may be input to the L input of switch SW3. Thus, (referring to FIG. 4), inverter IV2 may receive a logic low input and may apply logic high to one input of NOR gate NOR1. Thus, control signal C2 may be logic low. Referring once again to FIG. 9, because switch SW7 may be programmed to select the LV input, power supply VCC may be applied to control signal C3. Thus control signal C3 may be logic high.

With control signal C2 at logic low, switch SW5 may be in a low impedance state (a closed position). Thus, reference potential generation circuit 1 may be connected to generate primary reference potential VREF0. Control signal C2 may be applied to switch SW4. With control signal C2 at a logic low (referring to FIG. 3), n-type IGFET N4 may be turned on and n-type IGFET N3 may be turned off. Node ND1 may be pulled low. Thus, p-type IGFET P1 may be turned on and node ND2 may be pulled to internal voltage VBOOT.

N-type IGFET N1 may be turned off and n-type IGFET N2 may be turned on. With n-type IGFET N1 turned off, bond pad PAD1 may be disconnected from primary reference potential VREF0. Switch SW6 may be programmed to select the LV input. This may place switch SW6 in an open circuit condition. Thus, bond pad PAD1 may be disconnected from secondary reference potential VREF.

Primary reference potential VREF0 may be input to secondary reference potential generation circuit 70. Secondary reference potential generation circuit may generate a potential that is proportional to primary reference potential VREF0 as determined by a ratio of resistors (R2 and R3). Because control signal C3 is logic high, the potential generated by secondary reference potential generation circuit 70 may be applied to secondary reference potential VREF.

In this way, both primary reference potential VREF0 and secondary reference potential VREF may be internally generated during normal operation.

Accordingly, in the embodiment illustrated with in FIGS. 1–9, only one bond pad PAD1 may be used for supplying a input reference voltage in the SSTL normal operation, and an internal potential and input reference potential for a test mode in both the SSTL and LVTTL modes. In normal operation in LVTTL mode, the internal potential and input reference potential may be internally generated.

In the embodiment illustrated in FIG. 1, resistors (R1 to R3) may be resistive elements formed by a transistor, such as an IGFET.

When in a normal operation in SSTL mode, a high potential may be applied to switch SW2. This high potential may force control signal C2 low, which may allow reference potential generation circuit 1 to generate primary reference potential VREF0 and a potential applied to bond pad PAD1 to be applied to secondary reference potential VREF. However, when a transistor is used for resistor R1, the response for applying a high potential to switch SW2 may be delayed during power-up. A transistor used for resistor R1 may not conduct until a gate potential is more than a threshold voltage. Further, a transistor used for resistor R1 may conduct weakly when a potential from a source to drain is small. These factors can contribute to a high potential input to switch SW2 to be delayed. This can result in an unreliable primary and secondary reference potentials (VREF0 and VREF) at this time.

Figure 10:
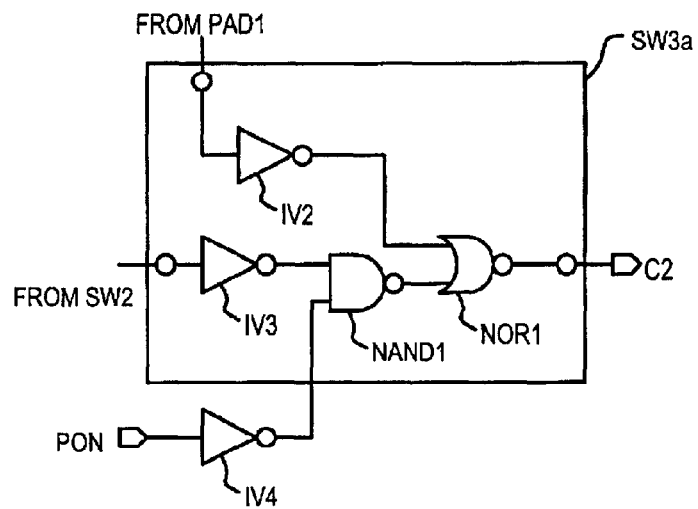
FIG. 10 is a circuit schematic of switch according to an embodiment.

Referring now to FIG. 10, a circuit schematic of switch SW3*a* according to an embodiment is set forth.

Switch SW3*a* may be used as switch SW3 in the embodiment illustrated in FIG. 1. Switch SW3*a* may include inverters (IV2 to IV4), NAND gate NAND1, and a NOR gate NOR1. Inverter IV2 may have an input connected to bond pad PAD1 and an output connected to an input of NOR gate NOR1. Inverter IV3 may have an input/connected to a signal from switch SW2 and an output connected to an input of NAND gate NAND1. Inverter IV4 may have an input connected to a power-up signal PON and an output connected to an input of NAND gate NAND1. NAND gate NAND1 may have an output connected to an input of NOR gate NOR1. NOR gate NOR1 may generate control signal C2, which may be connected to switches (SW4, SW5, and SW7) of FIG. 1.

Figure 11:
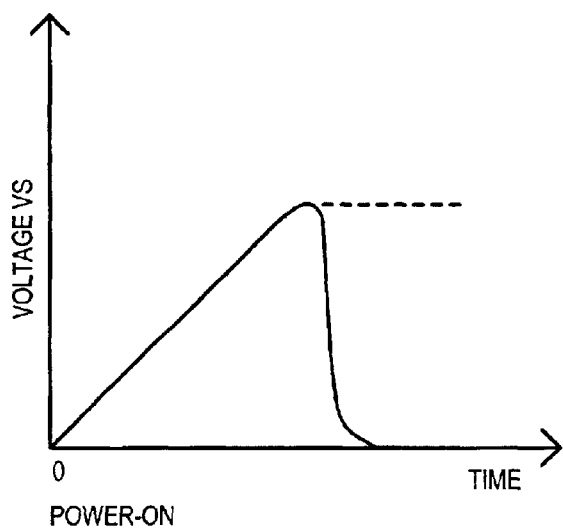
FIG. 11 is a waveform illustrating power-up signal according to an embodiment.
Figure 12:
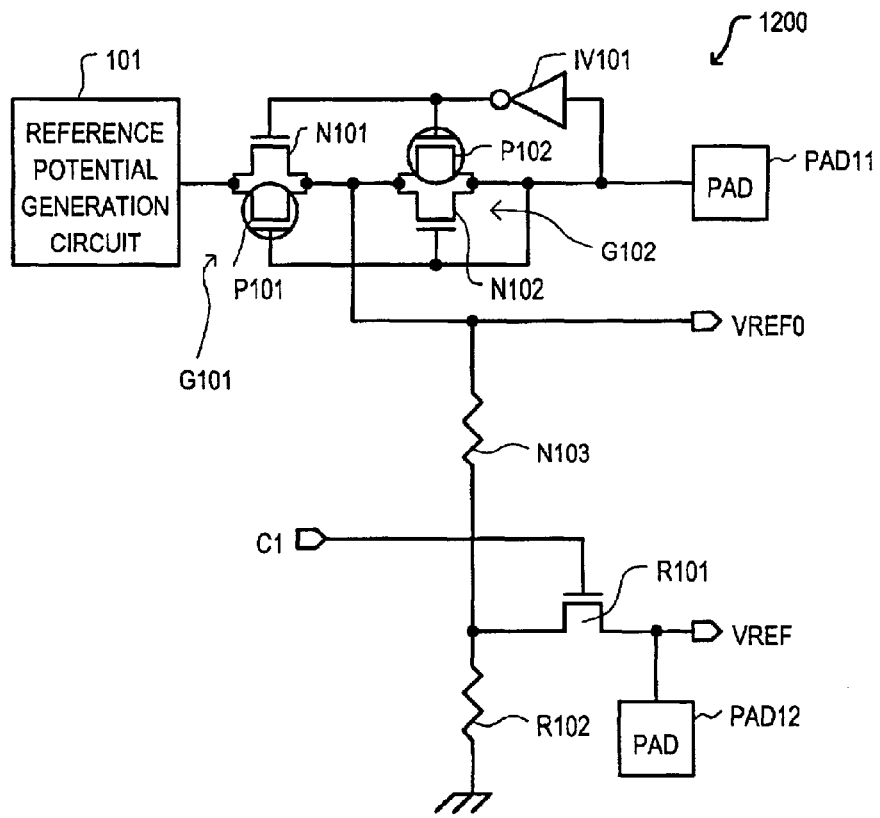
FIG. 12 is a circuit schematic diagram of a conventional bond option circuit.
Figure 14:
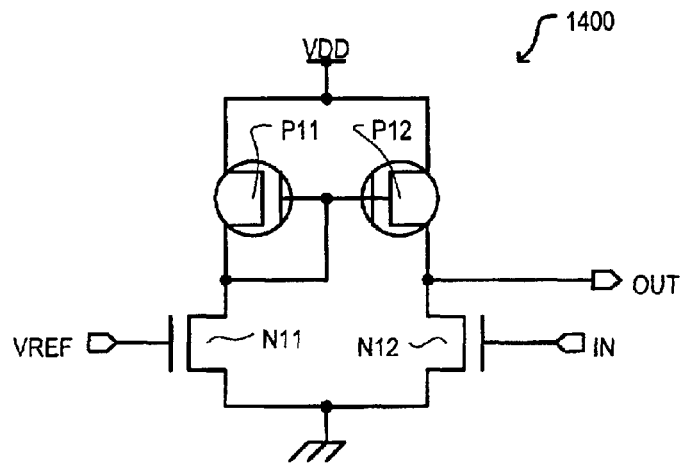
FIG. 14 is a circuit diagram of an input buffer.
Figure 13:
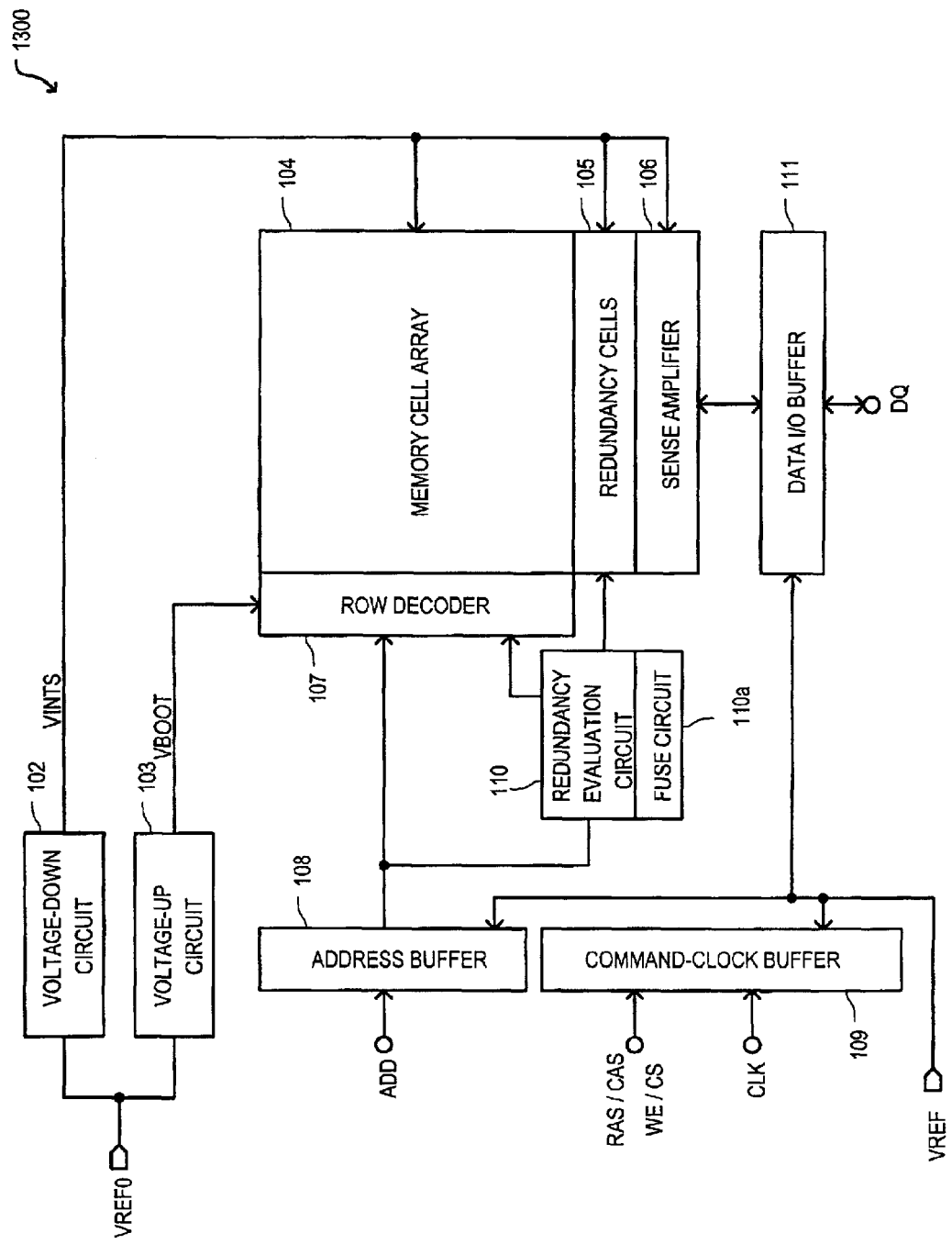
FIG. 13 is a block schematic diagram of a conventional semiconductor memory device.

Referring now to FIG. 11, a waveform illustrating power-up signal PON according to an embodiment is set forth.

During power-up, a logic high power-up signal PON may force control signal C2 to a logic low level in the switch SW3*a* illustrated in FIG. 10. In this way, reference potential generation circuit 1 may be electrically connected through switch SW5 to primary reference potential VREF0 and bond pad PAD1 may be electrically connected through switches (SW4 and SW6) to secondary reference potential VREF.

After power-up, power-up signal PON may transition to a logic low and switch SW3*a* may operate in essentially the same manner as switch SW3 illustrated in FIG. 4.

It is understood that the embodiments described above are exemplary and the present invention should not be limited to those embodiments.

In the embodiments illustrated, a desired potential for primary reference potential VREF0 may be applied externally on bond pad PAD1 in a test mode when the reference potential generation circuit 1 is not functioning properly. This may allow a semiconductor device to be characterized or debugged.

The test mode may be used to evaluate the proper level of reference potential generation circuit 1. Then, fuses (F1 to F4, in FIG. 5) may be selectively programmed.

Switches (SW1, SW2, SW6, and SW7) may be other than metal mask optional switches. For example, switches (SW1, SW2, SW6, and SW7) may include programmable fuses, as just one example.

The above embodiments are illustrated with a semiconductor memory device such as a DRAM by way of example, but this should not be construed as a limitation. The invention may be applied to other types of semiconductor devices.

Thus, while the various particular embodiments set forth herein have been described in detail, the present invention could be subject to various changes, substitutions, and alterations without departing from the spirit and scope of the invention. Accordingly, the present invention is intended to be limited only as defined by the appended claims.

What is claimed is:

1. A semiconductor device having a first operational mode, comprising:
    a reference configuration circuit providing a first and second reference potential, the reference configuration circuit including
        a bond pad for receiving an external potential to be used as the second reference potential in the first operational mode;
    a test mode of operation in which the bond pad receives an external potential to be used as the first reference potential.

2. The semiconductor device according to claim 1, wherein:
    the reference configuration circuit includes a second reference potential generator receiving the first reference potential and providing the second reference potential in the test mode.

3. The semiconductor device according to claim 1, wherein:
    the second reference potential is an input buffer reference potential.

4. The semiconductor device according to claim 1 is programmably configured to operate in the first operational mode or a second operational mode.

5. The semiconductor device according to claim 4, wherein:
    the reference configuration circuit includes a second reference potential generator receiving the first reference potential;
    in normal operation, when the semiconductor device is configured to operate in the first operational mode, the first reference potential is generated by a first reference potential generator; and when the semiconductor device is configured to operate in the second operational mode, the second reference potential is generated by the second reference potential generator.

6. The semiconductor device according to claim 5, wherein:
in the test mode of operation, the second reference potential is generated by the second reference potential generator.

7. The semiconductor device according to claim 1, wherein the reference configuration circuit includes a fuse that is intact in the test mode of operation and blown in the first operational mode.

8. A semiconductor device having a first operating mode, comprising:
a reference configuration circuit, including
a bond pad;
a control circuit providing a first control signal having a first logic level in a normal operation and a second logic level in a test operation; and
a reference selection circuit coupled to receive the control signal and provide a first reference potential at a first node and a second reference potential at a second node;
wherein in the normal operation, the selection circuit provides a potential received on the bond pad to the second node and in the test operation the selection circuit provides the potential received on the bond pad to the first node.

9. The semiconductor device according to claim 8, wherein:
the control circuit includes a programmable device having a first state in the test operation and a second state in the normal operation.

10. The semiconductor device according to claim 8, wherein:
the reference selection circuit includes a first switch including a voltage translator coupled to receive the first control signal and provide a switch control output coupled to a control gate of a controllable impedance device having a controllable impedance path coupled between the bond pad and the first node.

11. The semiconductor device according to claim 8, wherein the reference configuration circuit further includes:
a reference potential generation circuit coupled to the reference selection circuit; and
the reference selection circuit includes a second switch coupled to receive the first control signal and provide a low impedance path between the reference potential generation circuit and the first node when the first control signal has the first logic level and a high impedance path between the reference potential generation circuit and the first node when the first control signal has the second logic level.

12. The semiconductor device according to claim 8, wherein the reference configuration circuit further includes:
a second reference potential generation circuit coupled to the reference selection circuit; and
the reference selection circuit includes a third switch coupled to receive the first control signal and provide a low impedance path between the second reference potential generation circuit and the second node when the first control signal has the second logic level and a high impedance path between the reference potential generation circuit and the second node when the first control signal has the first logic level.

13. The semiconductor device according to claim 8, wherein:
the second reference potential generation circuit is coupled to receive the first reference potential and generate a potential that is proportional to the first reference potential.

14. The semiconductor device according to claim 8, wherein the control circuit is coupled to receive a power-up signal that forces the first control signal to the second logic level during power-up.

15. A semiconductor device programmably configured to operate in a first operational mode having first input signal specifications or a second operational mode having second input signal specifications, comprising:
a reference configuration circuit providing a first and second reference potential, the reference configuration circuit including
a bond pad for receiving an external potential to be used as the second reference potential in the first operational mode;
a test mode of operation in which the bond pad receives an external potential to be used as the first reference potential.

16. The semiconductor device according to claim 15, wherein:
the reference configuration circuit includes a second reference potential generator;
in normal operation, when the semiconductor device is configured to operate in the first operational mode the first reference potential is generated by a first reference potential generator; and
when the semiconductor device is configured to operate in the second operational mode, the second reference potential is generated by the second reference potential generator.

17. The semiconductor device according to claim 16, wherein the second reference potential is used as an input buffer reference potential.

18. The semiconductor device according to claim 15, including:
the reference configuration circuit includes a first reference potential generation circuit providing the first reference potential in a normal operation for both the first and second operational modes; and
the first reference generation circuit includes at least one programmable device for adjusting the potential provided.

19. The semiconductor device according to claim 15, further including:
a voltage-down circuit coupled to receive the first reference potential and generate an internal supply potential having a potential less than the first reference potential.

20. The semiconductor device according to claim 15 is a semiconductor memory device and the first operational mode is a SSTL mode and the second operational mode is a LVTTL mode.

* * * * *